United States Patent
Park et al.

(10) Patent No.: US 12,464,823 B2
(45) Date of Patent: Nov. 4, 2025

(54) LIGHT EMITTING DISPLAY APPARATUS

(71) Applicant: LG DISPLAY CO., LTD., Seoul (KR)

(72) Inventors: EunJi Park, Paju-si (KR); Ji-Heun Lee, Paju-si (KR); Kyungmin Kim, Paju-si (KR)

(73) Assignee: LG Display Co., Ltd (KR)

( * ) Notice: Subject to any disclaimer, the term of this patent is extended or adjusted under 35 U.S.C. 154(b) by 960 days.

(21) Appl. No.: 17/528,695

(22) Filed: Nov. 17, 2021

(65) Prior Publication Data
US 2022/0199655 A1 Jun. 23, 2022

(30) Foreign Application Priority Data
Dec. 17, 2020 (KR) .......................... 10-2020-0177037

(51) Int. Cl.
| | |
|---|---|
| H01L 27/12 | (2006.01) |
| H10D 86/40 | (2025.01) |
| H10D 86/60 | (2025.01) |
| H10K 59/131 | (2023.01) |
| H10H 29/14 | (2025.01) |
| H10K 59/12 | (2023.01) |

(52) U.S. Cl.
CPC ........... H10D 86/443 (2025.01); H10D 86/60 (2025.01); H10K 59/131 (2023.02); *H10H 29/142* (2025.01); *H10K 59/12* (2023.02)

(58) Field of Classification Search
None
See application file for complete search history.

(56) References Cited

U.S. PATENT DOCUMENTS

| | | |
|---|---|---|
| 2015/0270323 A1 | 9/2015 | Cho et al. |
| 2021/0364877 A1* | 11/2021 | Cha .................. G02F 1/136286 |
| 2022/0085133 A1* | 3/2022 | Yuan .................... G09G 3/3266 |

FOREIGN PATENT DOCUMENTS

| | | |
|---|---|---|
| KR | 20150057661 A | 5/2015 |
| KR | 2015-0111005 A | 10/2015 |

(Continued)

OTHER PUBLICATIONS

Office Action in Korean Appln. No. 10-2020-0177037, mailed on Aug. 19, 2025, 13 pages (with English translation).

*Primary Examiner* — William C Trapanese

(74) *Attorney, Agent, or Firm* — Fish & Richardson P.C.

(57) ABSTRACT

A light emitting display apparatus is provided, which may repair an opened gate line using power supply lines. The light emitting display apparatus comprises a gate line provided along a first direction of a light emitting display panel, a voltage supply line provided in the light emitting display panel along a second direction different from the first direction, at least three pixels provided between two adjacent voltage supply lines and connected to the gate line, a first branch voltage supply line extended from a first voltage supply line of the two voltage supply lines along the first direction and connected to at least one pixel adjacent to the first voltage supply line among the at least three pixels, and a second branch voltage supply line extended from a second voltage supply line of the two voltage supply lines along the first direction and connected with at least one pixel adjacent to the second voltage supply line among the at least three pixels, wherein an end of the first branch voltage supply line and an end of the second branch voltage supply line are adjacent to each other.

17 Claims, 14 Drawing Sheets

(56) References Cited

FOREIGN PATENT DOCUMENTS

| KR | 2017-0026900 A | 3/2017 |
| KR | 2018-0025718 A | 3/2018 |
| KR | 20190131254 A | 11/2019 |

* cited by examiner

LIGHT EMITTING DISPLAY APPARATUS

CROSS-REFERENCE TO RELATED APPLICATION

This application claims the priority of the Korean Patent Application No. 10-2020-0177037 filed on Dec. 17, 2020, which is hereby incorporated by reference in its entirety as if fully set forth herein.

BACKGROUND

Field of the Disclosure

The present disclosure relates to a light emitting display panel and a light emitting display apparatus using the same.

Description of the Background

A light emitting display apparatus is an apparatus outputting light by using a light emitting element and includes a light emitting display panel provided with the light emitting elements.

The light emitting display panel includes various kinds of lines such as data lines, gate lines, and power supply lines.

The gate lines are commonly connected to pixels provided in a horizontal line, and a data voltage can be charged in the pixels only when a gate pulse is supplied to the gate lines. Therefore, when one of the gate lines is disconnected and thus opened, normal light cannot be output from the pixels provided in the corresponding horizontal line.

SUMMARY

Accordingly, the present disclosure has been made in view of the above problems and is to provide a light emitting display apparatus having an opened gate line repaired by connecting using power supply lines.

The present disclosure as mentioned above and additional features of the present disclosure will be clearly understood by those skilled in the art from the following description of the present disclosure.

In accordance with an aspect of the present disclosure, the above and other can be accomplished by the provision of a light emitting display apparatus comprising a gate line provided along a first direction of a light emitting display panel, a voltage supply line provided in the light emitting display panel along a second direction different from the first direction, at least three pixels provided between two adjacent voltage supply lines and connected to the gate line, a first branch voltage supply line extended from a first voltage supply line of the two voltage supply lines along the first direction and connected to at least one pixel adjacent to the first voltage supply line among the at least three pixels, and a second branch voltage supply line extended from a second voltage supply line of the two voltage supply lines along the first direction and connected with at least one pixel adjacent to the second voltage supply line among the at least three pixels, wherein an end of the first branch voltage supply line and an end of the second branch voltage supply line are adjacent to each other.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
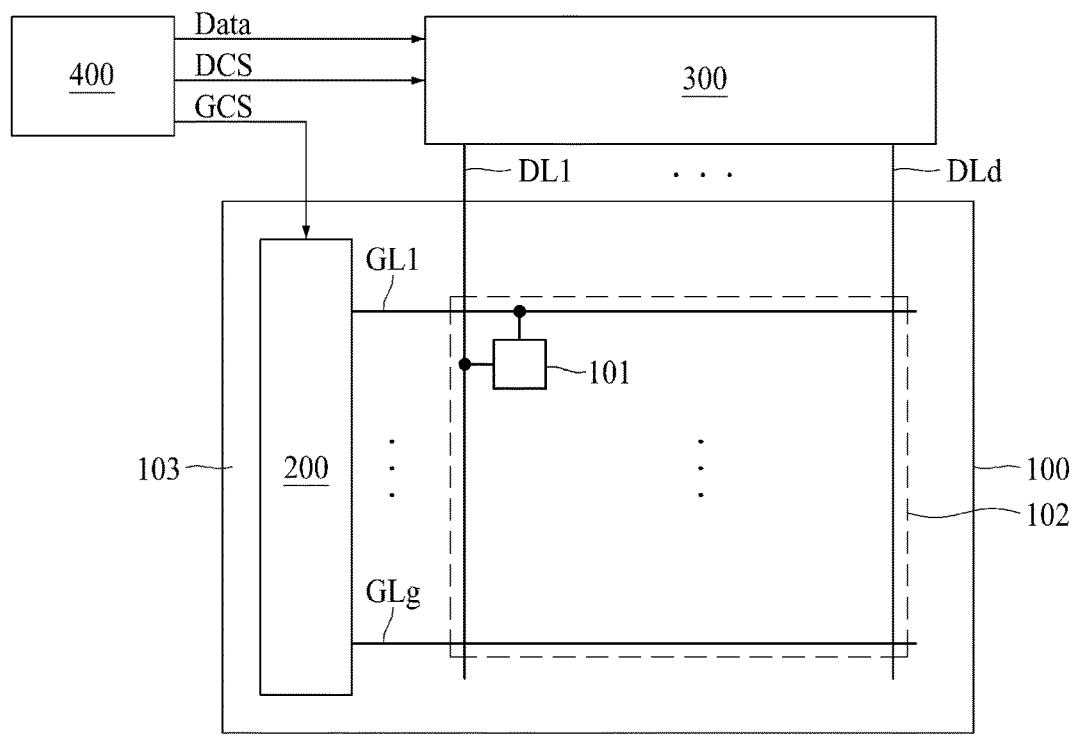
FIG. 1 is an exemplary view illustrating a structure of a light emitting display apparatus according to the present disclosure.

Advantages and features of the present disclosure and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete and will fully convey the scope of the present disclosure to those skilled in the art. Further, the present disclosure is only defined by scopes of claims.

In the drawings, the same or similar elements are denoted by the same reference numerals even though they are depicted in different drawings. Wherever possible, the same reference numbers will be used throughout the drawings to refer to the same or like parts.

A shape, a size, a ratio, an angle and a number disclosed in the drawings for describing aspects of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It should be understood that the term "at least one" includes all combinations related with any one item. For example, "at least one among a first element, a second element and a third element" may include all combinations of two or more elements selected from the first, second and third elements as well as each element of the first, second and third elements.

It will be understood that, although the terms "first," "second," etc. may be used herein to describe various elements, these elements should not be limited by these terms. These terms are only used to distinguish one element from another. For example, a first element could be termed a second element and, similarly, a second element could be termed a first element, without departing from the scope of the present disclosure.

Features of various aspects of the present disclosure may be partially or overall coupled to or combined with each other and may be variously inter-operated with each other and driven technically as those skilled in the art can sufficiently understand. The aspects of the present disclosure may be carried out independently from each other or may be carried out together in co-dependent relationship.

Hereinafter, the aspect of the present disclosure will be described in detail with reference to the accompanying drawings.

Figure 2:
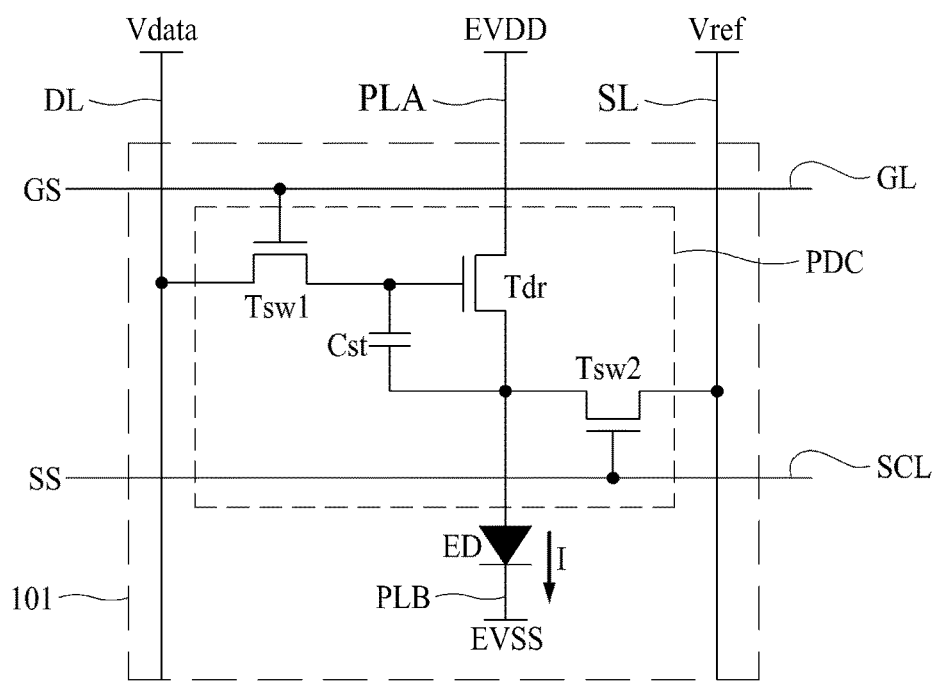
FIG. 2 is an exemplary view illustrating a structure of a pixel applied to a light emitting display apparatus according to the present disclosure.

FIG. 1 is an exemplary view illustrating a structure of a light emitting display apparatus according to the present disclosure, and FIG. 2 is an exemplary view illustrating a structure of a pixel applied to a light emitting display apparatus according to the present disclosure.

The light emitting display apparatus according to the present disclosure may constitute various electronic devices. The electronic device may include, for example, a smart phone, a tablet PC, a television, a monitor, or the like.

As shown in FIG. 1, the light emitting display apparatus according to the present disclosure includes a light emitting display panel 100 provided with pixels 101 to display an image, a data driver 300 for supplying data voltages Vdata to data lines DL1 to DLd provided in the light emitting display panel 100, a gate driver 200 for supplying gate voltages to gate lines GL1 to GLg provided in the light emitting display panel 100, and a controller 400 for controlling the data driver 300 and the gate driver 200, wherein g and d are natural numbers.

The light emitting display panel 100 includes a display area 102 and a non-display area 103. The display area 102 is provided with gate lines GL1 to GLg, data lines DL1 to DLd, voltage supply lines PLA and the pixels 101.

The display area 102 outputs an image, and the non-display area 103 surrounds the display area 102 and does not output an image.

As shown in FIG. 2, the pixel 101 provided in the light emitting display panel 100 may include a light emitting element ED, a switching transistor Tsw1, a storage capacitor Cst, a driving transistor Tdr, and a sensing transistor Tsw2. That is, the pixel 101 may include a pixel driving unit PDU and a light emitting unit, wherein the pixel driving unit PDU may include a switching transistor Tsw1, a capacitor Cst, a driving transistor Tdr and a sensing transistor Tsw2, and the light emitting unit may include a light emitting element ED.

Brightness of light may be controlled in accordance with a magnitude of a current I flowing in the light emitting element ED, the magnitude of the current I flowing in the light emitting element ED may be controlled by the driving transistor Tdr, and the driving transistor Tdr may be controlled by the data voltage Vdata.

The light emitting element ED may include any one of an organic light emitting layer, an inorganic light emitting layer and a quantum dot light emitting layer, or may include a deposited or mixed structure of an organic light emitting layer (or inorganic light emitting layer) and a quantum dot light emitting layer.

Also, the light emitting element ED may emit light corresponding to any one of various colors such as red, green and blue colors, or may emit white light.

The switching transistor Tsw1 constituting the pixel driving unit PDU is turned on or off by a gate signal GS supplied to the gate line GL, and the data voltage Vdata supplied through the data line DL is supplied to the driving transistor Tdr when the switching transistor Tsw1 is turned on.

A first voltage EVDD is supplied to the driving transistor Tdr and the light emitting element ED through the voltage supply line PLA, and a second voltage EVSS is supplied to the light emitting element ED through a voltage line PLB. The voltage supply line PLA and the voltage line PLB may be connected with a power supply unit through the data driver 300 or the gate driver 200, or may directly be connected with the power supply unit.

The sensing transistor Tsw2 is turned on or off by a sensing control signal SS supplied through a sensing control line SCL, and a sensing line SL may be connected to the sensing transistor Tsw2.

A reference voltage Vref may be supplied to the pixel 101 through the sensing line SL, and a sensing signal related to a characteristic change of the driving transistor Tdr may be transmitted to the sensing line SL through the sensing transistor Tsw2.

The pixel 101 applied to the present disclosure may be formed in the structure shown in FIG. 2, but the present disclosure is not limited thereto. Therefore, the pixel applied to the present disclosure may be changed in various forms in addition to the structure shown in FIG. 2.

In the light emitting display panel 100, pixel areas provided with pixels 101 are formed, and signal lines for supplying various signals to the pixel driving unit PDU provided in the pixel 101 are formed.

For example, in the light emitting display panel that includes the pixel 101 shown in FIG. 2, signal lines may include a gate line GL, a data line DL, a sensing control line SCL, a voltage supply line PLA, a voltage line PLB and a sensing line SL. The gate line GL may be used as the sensing control line SCL, and in this case, the gate line GL and the sensing control line SCL are formed as a single line. That is, the gate line GL may be connected to the switching transistor Tsw1 and the sensing transistor Tsw2.

Next, the controller 400 includes a data aligner for realigning input image data transmitted from an external system using a timing synchronization signal transmitted from the external system and supplying the realigned image data to the data driver 300, a control signal generator for generating a gate control signal GCS and a data control signal DCS using the timing synchronization signal, an input unit for receiving the timing synchronization signal and the input image data transmitted from the external system and transmitting them to the data aligner and the control signal generator, and an output unit for outputting the image data generated from the data aligner and the control signals DCS and GCS generated from the control signal generator to the data driver 300 or the gate driver 200.

The external system serves to drive the controller 400 and the electronic device. That is, when the electronic device is a smart phone, the external system receives various kinds of voice information, image information and text information through a wireless communication network and transmits the received image information to the controller 400. The image information may be the input image data.

The data driver 300 may be provided in a chip-on film attached to the light emitting display panel 100, and may also be connected to a main substrate provided with the controller 400. In this case, lines for electrically connecting the controller 400, the data driver 300 and the light emitting display panel 100 are provided in the chip-on-film. To this end, the lines are electrically connected to pads provided in the main substrate and the light emitting display panel 100. The main substrate is electrically connected with an external substrate on which the external system is mounted.

The data driver 300 may be directly mounted on the light emitting display panel 100 and then electrically connected with the main substrate.

However, the data driver 300 may be formed as one integrated circuit together with the controller 400, wherein the integrated circuit may be provided in the chip-on film or directly mounted on the light emitting display panel 100.

The data driver 300 converts the image data Data input from the controller 400 into the data voltages Vdata and supplies the data voltages Vdata of one horizontal line to the data lines DL1 to DLd every one horizontal period in which a gate pulse is supplied to the gate line GL. For example, the data driver 300 converts the image data Data into the data voltages Vdata using gamma voltages supplied from a gamma voltage generator, and outputs the data voltages Vdata to the data lines DL1 to DLd for an image output period.

In this case, the horizontal line refers to a virtual line formed along the gate line GL. In the horizontal line, pixels connected with the gate line GL are disposed in a row. That is, the horizontal line refers to a virtual line corresponding to the gate line GL.

Then, the gate driver 200 may be provided as an integrated circuit and then mounted on the non-display area 103, or may directly be embedded in the non-display area 103 using a gate-in-panel (GIP) scheme. When the gate-in-panel scheme is used, the transistors constituting the gate driver 200 may be provided in the non-display area 103 through the same process as that of the transistors provided in the respective pixels 101 of the display area 102.

When the gate pulse generated by the gate driver 200 is supplied to a gate of the switching transistor Tsw1 provided in the pixel 101, the switching transistor Tsw1 is turned on. When a gate-off signal is supplied to the switching transistor Tsw1, the switching transistor Tsw1 is turned off. The gate signal GS supplied to the gate line GL includes a gate pulse and a gate-off signal.

Finally, the external system serves to drive the controller 400 and the electronic device. That is, when the electronic device is a smart phone, the external system receives various voice information, image information and text information through a wireless communication network and transmits the received image information to the controller 400. The image information may be the input image data.

Hereinafter, a light emitting display panel having the pixel structure shown in FIG. 2 among various types of light emitting display panels will be described as an example of a light emitting display panel according to the present disclosure.

Figure 3A:
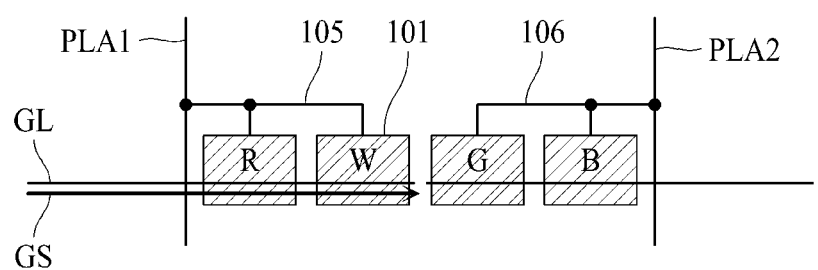
FIG. 3A is an exemplary view illustrating a light emitting display panel applied to a light emitting display apparatus according to the present disclosure.
Figure 3B:
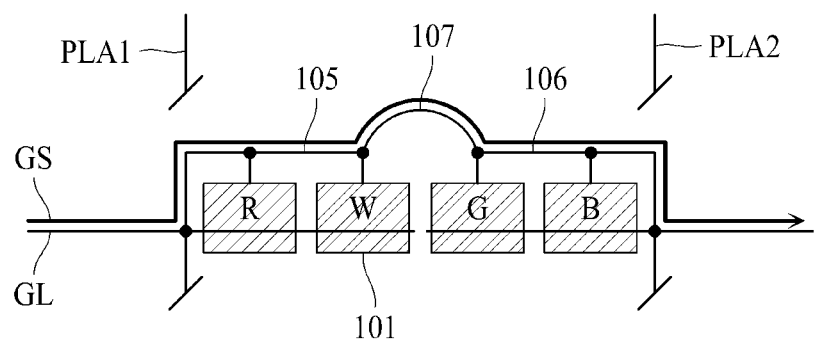
FIG. 3B is an exemplary view illustrating a light emitting display panel that is repaired.

FIG. 3A is an exemplary view illustrating a light emitting display panel applied to a light emitting display apparatus according to the present disclosure, and FIG. 3B is an exemplary view illustrating a light emitting display panel that is repaired.

As shown in FIGS. 1, 2, 3A and 3B, the display apparatus according to the present disclosure includes a gate line GL provided along a first direction of a light emitting display panel 100, a voltage supply line PLA provided in the light emitting display panel 100 along a second direction different from the first direction, at least three pixels provided between two voltage supply lines PLA1 and PLA2 adjacent to each other and connected to the gate line GL, a first branch voltage supply line 105 extended from the first voltage supply line PLA1 of the two voltage supply lines PLA1 and PLA2 along the first direction and connected with at least one pixel adjacent to the first voltage supply line PLA1 among at least three pixels, and a second branch voltage supply line 106 extended from the second voltage supply line PLA2 of the two voltage supply lines PLA1 and PLA2 along the first direction and connected with at least one pixel adjacent to the second voltage supply line PLA2 among at least three pixels. An end of the first branch voltage supply line 105 and an end of the second branch voltage supply line 106 are adjacent to each other.

In the following descriptions, the first direction refers to a direction in which the gate lines is extended, for example, a horizontal direction of the light emitting display panel 100, and the second direction refers to a direction in which the voltage supply line PLA is extended, for example, a vertical direction of the light emitting display panel 100.

In this case, at least three pixels may be provided between the two voltage supply lines PLA1 and PLA2. A light emitting display panel in which four pixels are provided between two voltage supply lines PLA1 and PLA2 is shown in FIGS. 3A and 3B.

At least three pixels of various colors may be provided between the two voltage supply lines PLA1 and PLA2. For convenience of description, as shown in FIGS. 3A and 3B, a light emitting display apparatus in which four pixels 101 are provided between two voltage supply lines PLA1 and PLA2 will be described as an example of the present disclosure.

The voltage supply line provided at a left side of the four pixels will be referred to as a first voltage supply line PLA1, and the voltage supply line provided at a right side of the four pixels will be referred to as a second voltage supply line PLA2.

The first branch voltage supply line 105 is extended from the first voltage supply line PLA1 along the first direction, and is connected to pixel driving units PDU of two pixels R and W adjacent to the first voltage supply line PLA1.

The second branch voltage supply line 106 is extended from the second voltage supply line PLA2 along the first direction, and is connected to pixel driving units PDU of two pixels G and B adjacent to the second voltage supply line PLA2.

That is, the first voltage supply line PLA1 and the second voltage supply line PLA2 are connected to the pixels R, W, G and B provided between the first voltage supply line PLA1 and the second voltage supply line PLA2.

The gate line GL is connected to a pixel driving unit of pixels provided along the gate line GL. In the light emitting display panel shown in FIGS. 3A and 3B, four pixels are connected to the gate line GL.

FIG. 3A shows that the gate line is disconnected between the white pixel W and the green pixel G. Hereinafter, the case that the gate line is disconnected is referred to as that the gate line is opened.

The gate signal GS cannot be supplied through the opened gate line. Therefore, normal light cannot be output in the pixels connected to the opened gate line.

FIG. 3B shows a repair process for connecting the first branch voltage supply line 105 and the second branch voltage supply line 106, which are adjacent to each other, with each other through a repair line 107 may be performed.

That is, in the repair process, the gate line GL is connected to the first voltage supply line PLA1 and the second voltage supply line PLA2, an upper end of the first voltage supply line PLA1 is separated from the first branch voltage supply line 105, an upper end of the second voltage supply line PLA2 is separated from the second branch voltage supply line 106, the first voltage supply line PLA1 and the second voltage supply line PLA2 on a lower end of the gate line GL are opened, and the first branch voltage supply line 105 and the second branch voltage supply line 106, which are adjacent to each other, are connected with each other through the repair line 107.

In this case, as shown in FIG. 3B, the gate signal GS supplied from the gate driver 200 provided on a left side of the first voltage supply line PLA1 may be supplied to the pixels 101 provided on a right side of the second voltage supply line PLA2 through the first voltage supply line PLA1 connected with the gate line GL, the first branch voltage supply line 105 connected with the first voltage supply line PLA1, the repair line 107 connected with the first branch voltage supply line 105, the second branch voltage supply line 106 connected with the repair line 107, the second voltage supply line PLA2 connected with the second branch voltage supply line 106 and the gate line GL connected with the second voltage supply line PLA2.

That is, according to the present disclosure, when the gate line is opened between the first voltage supply line PLA1 and the second voltage supply line PLA2, the gate signal GS cannot be supplied to the four pixels R, W, G and B provided between the first voltage supply line PLA1 and the second voltage supply line PLA2, but the gate signal GS may be supplied to the other pixels connected with the gate line.

Therefore, according to the present disclosure, light may normally be output from the other pixels except four pixels among the pixels connected to the opened gate line. Therefore, yield of the light emitting display apparatus may be improved.

Hereinafter, the structure of the present disclosure, which is described with reference to FIG. 3B, will be described in detail with reference to FIGS. 4 to 13B.

Figure 4:
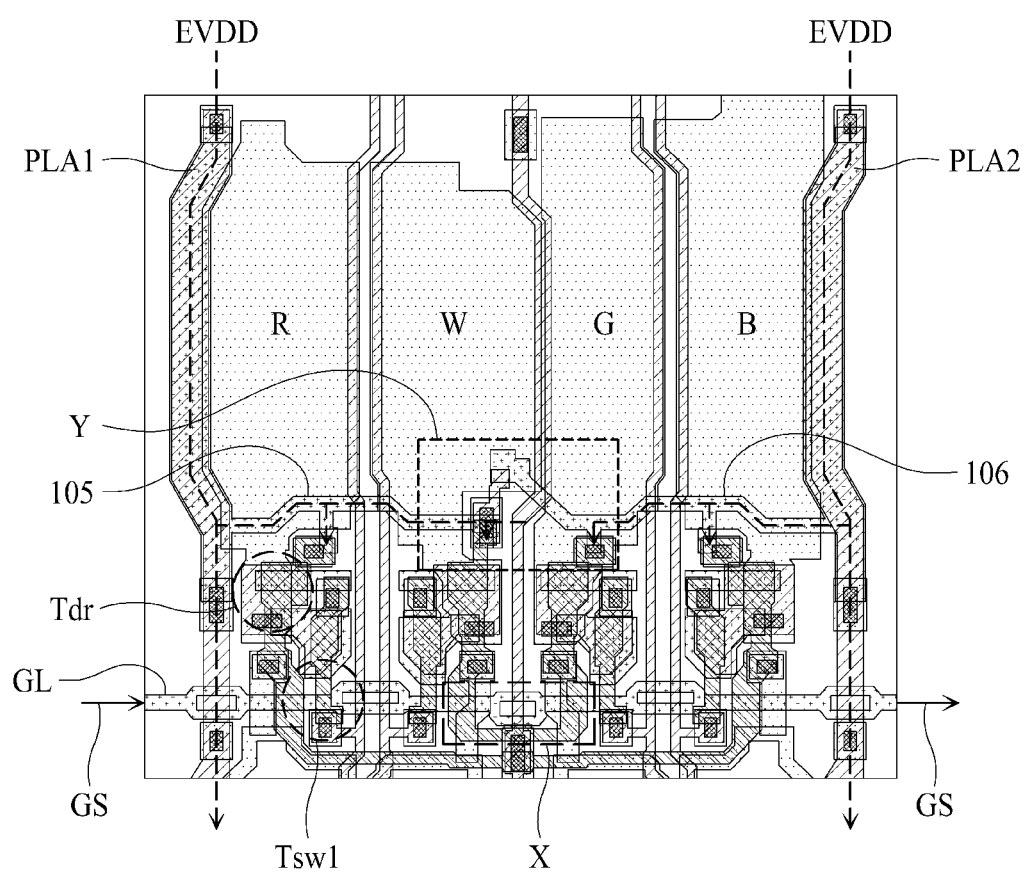
FIG. 4 is an exemplary view illustrating four pixels provided in a light emitting display panel applied to a light emitting display apparatus according to the present disclosure.

FIG. 4 is an exemplary view illustrating four pixels provided in a light emitting display panel applied to a light emitting display apparatus according to the present disclosure, and FIGS. 5A to 5E are exemplary views illustrating a method of manufacturing a light emitting display panel shown in FIG. 4.

As described above, the light emitting display apparatus according to the present disclosure includes a gate line GL, a first voltage supply line PLA1, a second voltage supply line PLA2, four pixels R, W, G and B provided between two voltage supply lines PLA1 and PLA2, which are adjacent to each other, and connected to the gate line GL, a first branch voltage supply line 105 and a second branch voltage supply line 106, wherein an end of the first branch voltage supply line 105 and an end of the second branch voltage supply line 106 are adjacent to each other.

When the gate line GL to which four pixels 101 are connected is not opened, as shown in FIG. 4, the first voltage EVDD supplied through the first voltage supply line PLA1 is supplied to the red pixel R and the white pixel W through the first branch voltage supply line 105, and the first voltage EVDD supplied through the second voltage supply line PLA2 is supplied to the green pixel G and the blue pixel B through the second branch voltage supply line 106. Further, the gate signal GS is supplied to all pixels connected to the gate line GL as well as the four pixels R, W, G and B through the gate line GL.

That is, the light emitting display panel 100 of a normal state in which the gate line GL is not opened is shown in FIG. 4.

In this case, in the area indicated by Y in FIG. 4, the end of the first branch voltage supply line 105 and the end of the second branch voltage supply line 106 are adjacent to each other but are not connected to each other.

The method of manufacturing the light emitting display panel having the structure described as above will briefly be described with reference to FIGS. 5A to 5E.

Figure 5A:
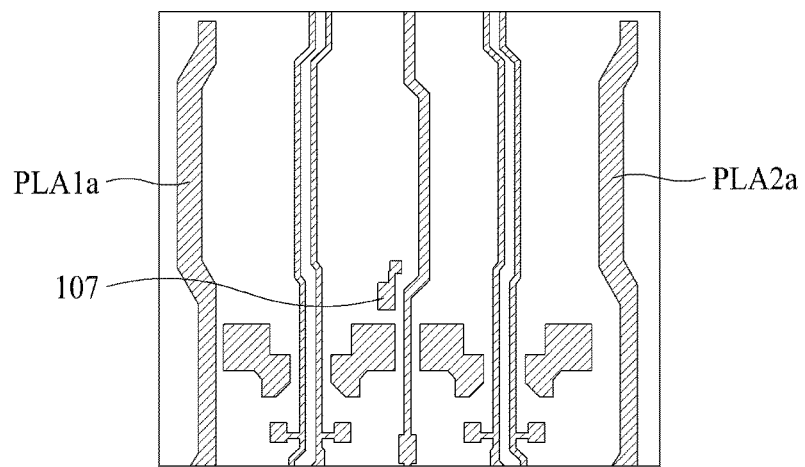
FIGS. 5A to 5E are exemplary views illustrating a method of manufacturing a light emitting display panel shown in FIG. 4.

First of all, as shown in FIG. 5A, light shielding electrodes including a first light shielding voltage supply line PLA1a, a second light shielding voltage supply line PLA2a and a repair line 107 are provided on a substrate.

The first light shielding voltage supply line PLA1a includes a first voltage supply line PLA1, and the second light shielding voltage supply line PLA2a includes a second voltage supply line PLA2.

Figure 5B:
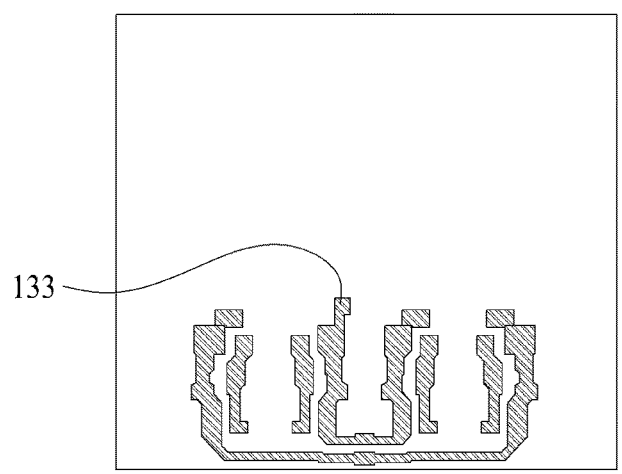

After the light shielding electrodes are covered by a buffer, as shown in FIG. 5B, active electrodes 133 used as semiconductors of transistors constituting the pixel driving unit PDU are provided on an upper end of the buffer. The active electrodes 133 may be a double layer comprised of metal layer/semiconductor layer, but is not limited thereto, and the active electrodes 133 may be a single layer including only a semiconductor layer.

Figure 5C:
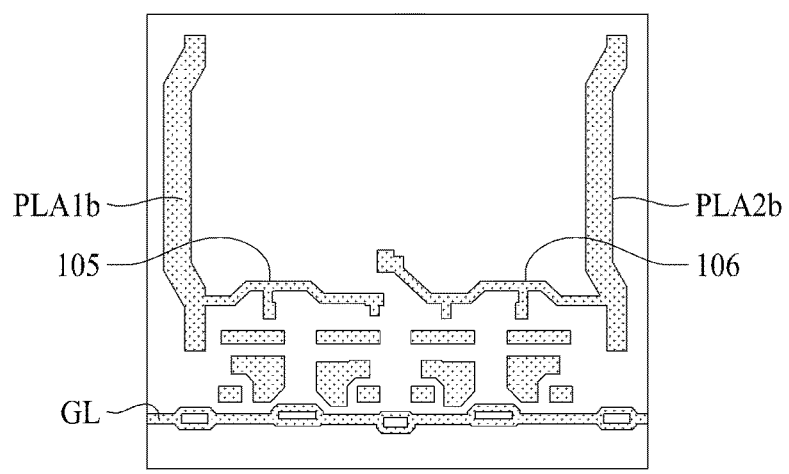

Next, after the active electrodes are covered by a gate insulating layer, as shown in FIG. 5C, gate electrodes including a first gate voltage supply line PLA1b, a second gate voltage supply line PLA2b, a first branch voltage supply line 105, a second branch voltage supply line 106 and a gate line GL are provided on an upper end of the gate insulating layer.

The first gate voltage supply line PLA1b includes a first voltage supply line PLA1, and the second gate voltage supply line PLA2b includes a second voltage supply line PLA2.

In particular, as shown in FIG. 5C, the end of the first branch voltage supply line 105 and the end of the second branch voltage supply line 106 are adjacent to each other, but are not connected to each other.

In this case, the end of the first branch voltage supply line 105 and the end of the second branch voltage supply line 106 are provided to overlap the repair line 107 shown in FIG. 5A.

Next, the gate electrodes are covered by a passivation layer, and the passivation layer is covered by a planarization layer.

Figure 5D:
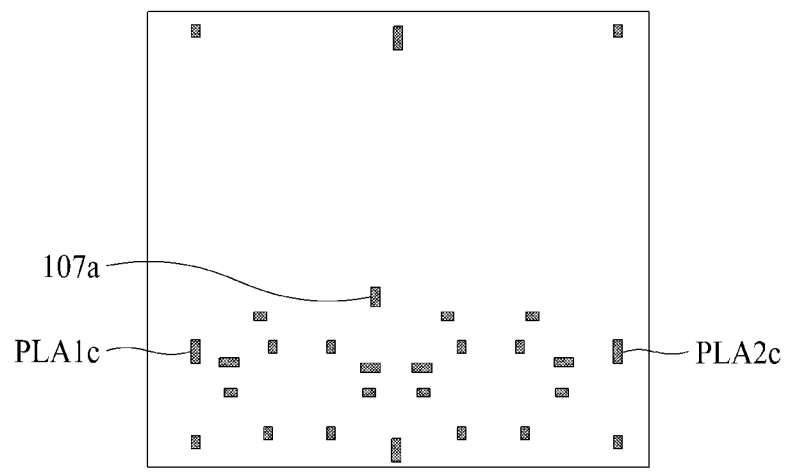
Figure 5E:
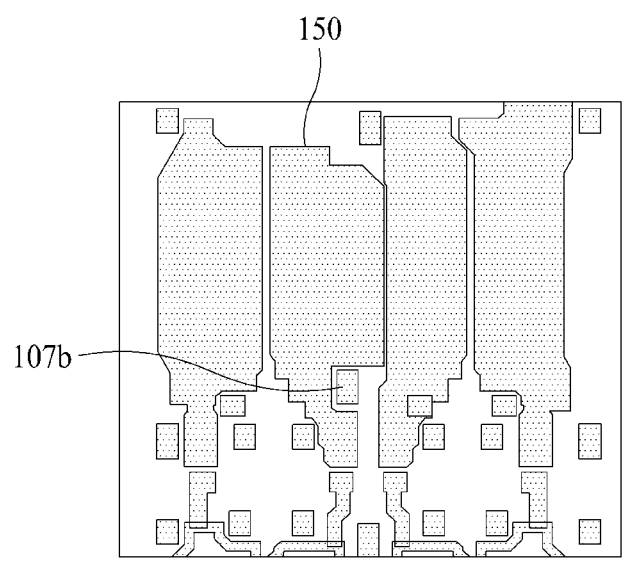

As shown in FIG. 5D, contact holes including a first voltage supply line contact hole PLA1c for connecting the first light shielding voltage supply line PLA1a shown in FIG. 5A with the first gate voltage supply line PLA1b shown in FIG. 5C, a second voltage supply line contact hole PLA2c for connecting the second light shielding voltage supply line PLA2a shown in FIG. 5A with the second gate voltage supply line PLA2b shown in FIG. 5C, and a first contact hole 107a for connecting the repair line 107 shown in FIG. 5A with the first branch voltage supply line 105 shown in FIG. 5C are provided in the passivation layer and the planarization layer.

That is, the first voltage supply line PLA1 includes a first light shielding voltage supply line PLA1a and a first gate voltage supply line PLA1b, which overlap each other, and the second voltage supply line PLA2 includes a second light shielding voltage supply line PLA2a and a second gate voltage supply line PLA2b, which overlap with each other.

Finally, an anode 150 constituting the light emitting element ED and pixel electrodes including a first pixel electrode 107b are provided in the planarization layer.

The first pixel electrode 107b is provided in the first contact hole 107a to connect the repair line 107 shown in FIG. 5A with the first branch voltage supply line 105 shown in FIG. 5C.

A light emitting layer constituting the light emitting device ED is provided on an upper end of the anode 150, and a cathode constituting the light emitting device ED is provided on an upper end of the light emitting layer.

At least one encapsulation film is provided on an upper end of the cathode, and thus the light emitting display panel is manufactured.

Figure 6A:
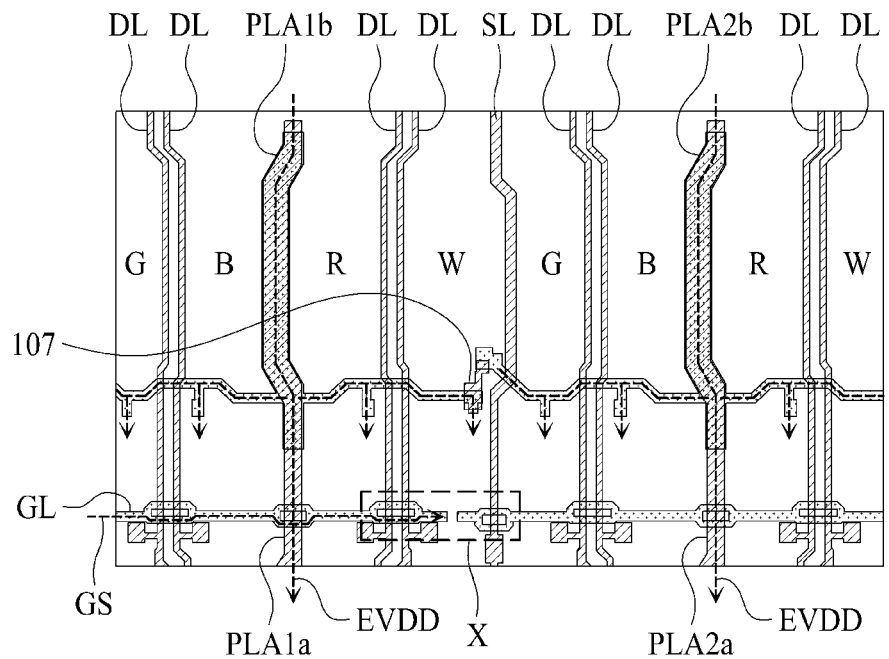
FIG. 6A is an exemplary view illustrating pixels comprised of light shielding electrodes shown in FIG. 5A and the gate electrodes shown in FIG. 5C.
Figure 6B:
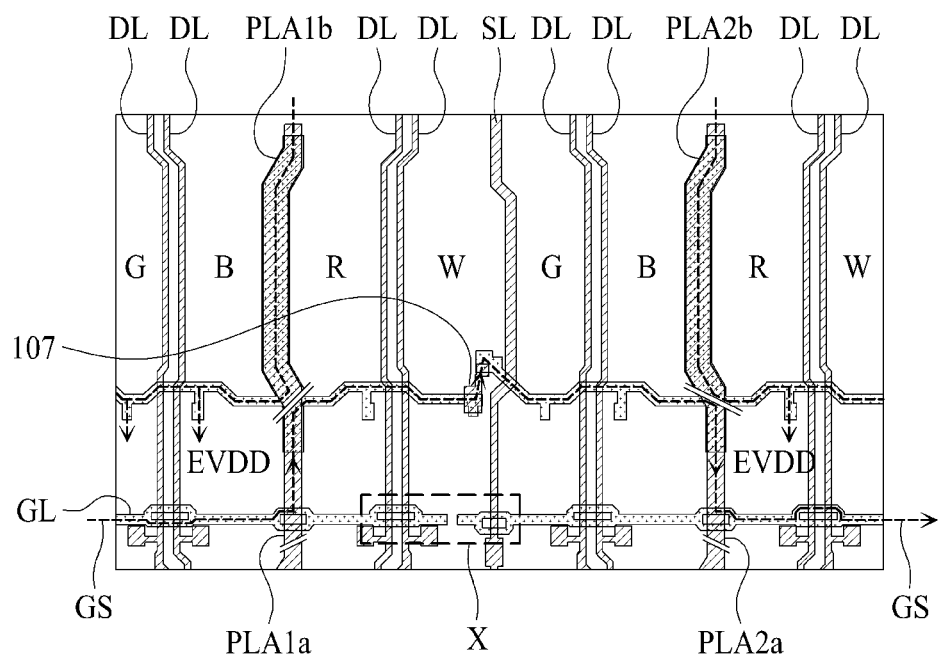
FIG. 6B is an exemplary view illustrating a light emitting display panel that is repaired.

FIG. 6A is an exemplary view illustrating pixels comprised of light shielding electrodes shown in FIG. 5A and gate electrodes shown in FIG. 5C. In particular, the first light shielding voltage supply line PLA1a, the second light shielding voltage supply line PLA2a, and the repair line 107 of the light shielding electrodes shown in FIG. 5A are only shown in FIG. 6A. Also, the first gate voltage supply line PLA1b, the first branch voltage supply line 105, the second gate voltage supply line PLA2b, the second branch voltage supply line 106 and the gate line GL of the gate electrodes shown in FIG. 5C are only shown in FIG. 6A. That is, the essential elements required for description of the present disclosure are only shown in FIG. 6A. FIG. 6B is an exemplary view illustrating a light emitting display panel that is repaired. That is, in FIG. 6B, the first branch voltage supply line 105 and the second branch voltage supply line 106, which are shown in FIG. 6A, are connected with each other through the repair line 107.

First of all, in the light emitting display panel shown in FIG. 6A, the first voltage EVDD supplied through the first voltage supply line PLA1 is supplied to the red pixel R and the white pixel W provided on the right side of the first voltage supply line PLA1 through the first branch voltage supply line 105 provided on the right side of the first voltage supply line PLA1. The first voltage EVDD supplied through the first voltage supply line PLA1 is also supplied to the green pixel G and the blue pixel B provided on the left side of the first voltage supply line PLA1.

The first voltage EVDD supplied through the second voltage supply line PLA2 is supplied to the green pixel G and the blue pixel B provided on the left side of the second voltage supply line PLA2 through the second branch voltage supply line 106 provided on the left side of the second voltage supply line PLA2. The first voltage EVDD supplied through the second voltage supply line PLA2 is also supplied to the red pixel R and the white pixel W provided on the right side of the second voltage supply line PLA2.

In this case, the gate line GL is connected in the area indicated by X in the light emitting display panel shown in FIG. 4, but the gate line GL is opened in the area indicated by X in the light emitting display panel shown in FIG. 6A. Therefore, the gate signal GS supplied from the gate driver 200 provided on the left side of the first voltage supply line PLA1 is not supplied to the pixels provided on the right side of the area indicated by X.

In this case, as shown in FIG. 6B, a repair process for connecting the first branch voltage supply line 105 and the second branch voltage supply line 106, which are adjacent to each other, with each other through the repair line 107 may be performed.

In the repair process, the first branch voltage supply line 105 and the second branch voltage supply line 106 are connected to each other through the repair line 107, the gate line GL and the first light shielding voltage supply line PLA1a are connected with each other in an area where the gate line GL and the first light shielding voltage supply line PLA1a cross each other, and the gate line GL and the second light shielding voltage supply line PLA2a are connected with each other in an area where the gate line GL and the second light shielding voltage supply line PLA2a cross each other.

Since the first light shielding voltage supply line PLA1a is connected with the first gate voltage supply line PLA1b, the gate line GL is connected with the first gate voltage supply line PLA1b.

Since the second light shielding voltage supply line PLA2a is connected with the second gate voltage supply line PLA2b, the gate line GL is connected with the second gate voltage supply line PLA2b.

In an area of the first gate voltage supply line PLA1b, from which the first branch voltage supply line 105 is diverged, the first gate voltage supply line PLA1b is opened and the first light shielding voltage supply line PLA1a is also opened. Therefore, the first voltage EVDD transmitted from the upper end of the light emitting display panel shown in FIG. 6B is not supplied to the red pixel R and the white pixel W through the first branch voltage supply line 105. In this case, the upper end of the first voltage supply line PLA1 that is opened is connected to the branch voltage supply line extended to the left side of the first voltage supply line PLA1. Therefore, the first voltage EVDD transmitted from the upper end of the light emitting display panel shown in FIG. 6B may be transmitted to the green pixel G and the blue pixel B through the branch voltage supply line extended to the left side of the first voltage supply line PLA1.

In the same manner as the first voltage supply line PLA1, in an area of the second gate voltage supply line PLA2b, from which the second branch voltage supply line 106 is diverged, the second gate voltage supply line PLA2b is opened and the second light shielding voltage supply line PLA2a is also opened. Therefore, the first voltage EVDD transmitted from the upper end of the light emitting display panel shown in FIG. 6B is not supplied to the green pixel G and the blue pixel B through the second branch voltage supply line 106. In this case, the upper end of the second voltage supply line PLA2 that is opened is connected with the branch voltage supply line extended to the right side of the second voltage supply line PLA2. Therefore, the first voltage EVDD transmitted from the upper end of the light emitting display panel shown in FIG. 6B may be transmitted to the red pixel R and the white pixel W through the branch voltage supply line extended to the right side of the second voltage supply line PLA2.

The first light shielding voltage supply line PLA1a is also opened on the lower end of the area in which the first light shielding voltage supply line PLA1a and the gate line GL cross each other. Therefore, the first voltage EVDD supplied from the lower end of the light emitting display panel shown in FIG. 6B is not supplied to the area where the first light shielding voltage supply line PLA1a and the gate line GL cross each other.

In the same manner as the first light shielding voltage supply line PLA1a, the second light shielding voltage supply line PLA2a is also opened on the lower end of the area where the second light shielding voltage supply line PLA2a and the gate line GL cross each other. Therefore, the first voltage EVDD supplied from the lower end of the light emitting display panel shown in FIG. 6B is not supplied to the area where the second light shielding voltage supply line PLA2a and the gate line GL cross each other.

As shown in FIG. 6B, a closed circuit connected to the gate line GL provided on the left side of the first voltage supply line PLA1, the first voltage supply line PLA1, the first branch voltage supply line 105, the repair line 107, the second branch voltage supply line 106, the second voltage supply line PLA2 and the gate line GL provided on the right side of the second voltage supply line PLA2 is formed through the repair process described as above.

Therefore, the gate signal GS supplied from the gate driver 200 provided on the left side of the first voltage supply line PLA1 may be transmitted through the closed circuit.

Therefore, even though the gate line is opened between the first voltage supply line PLA1 and the second voltage supply line PLA2, the gate signal GS may be supplied to the other pixels except the four pixels R, W, G and B provided between the first voltage supply line PLA1 and the second voltage supply line PLA2.

Therefore, according to the present disclosure, light may normally be output from the other pixels except four pixels among the pixels connected to the opened gate line. As a result, yield of the light emitting display apparatus may be improved.

Figure 7:
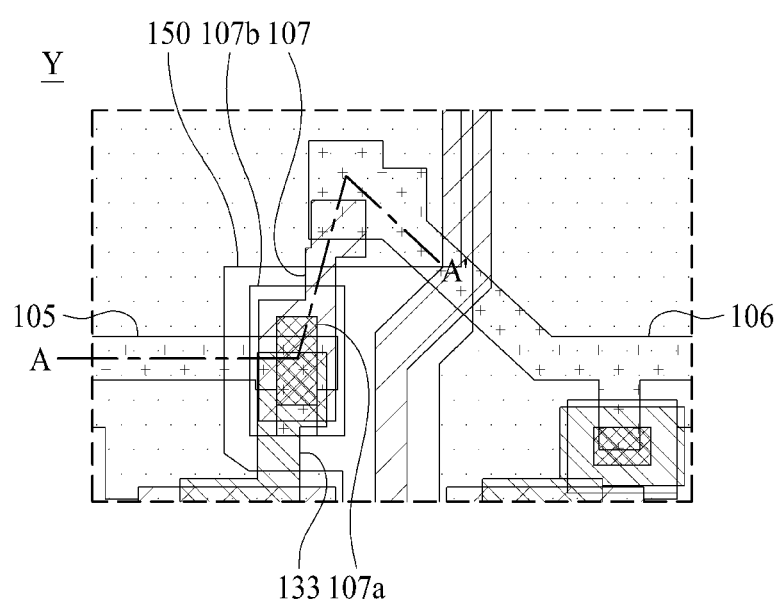
FIG. 7 is an enlarged exemplary view illustrating an area Y shown in FIG. 4.
Figure 8A:
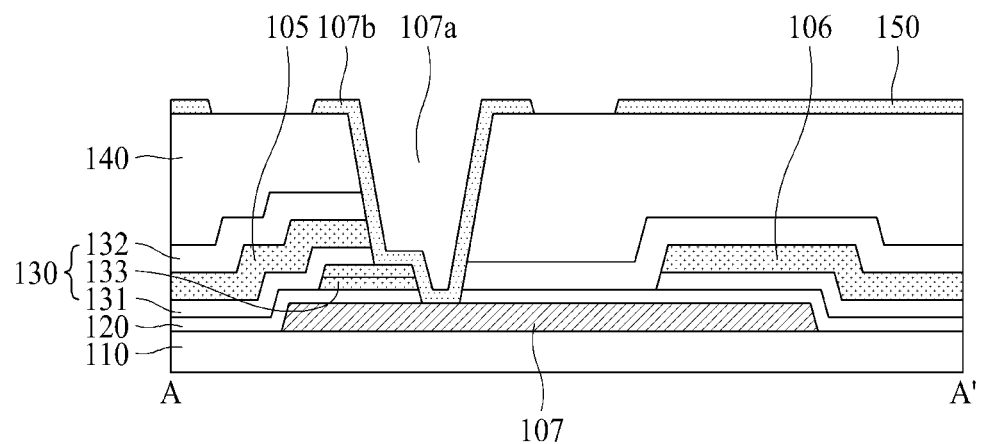
FIG. 8A is an exemplary view illustrating a cross-section taken along line A-A' shown in FIG. 7.
Figure 8B:
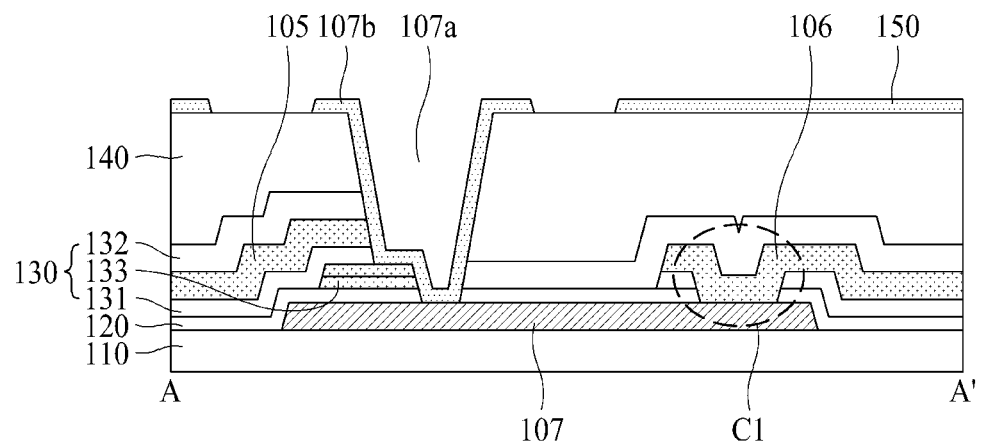
FIG. 8B is another exemplary view illustrating a cross-section taken along line A-A' shown in FIG. 7.

FIG. 7 is an enlarged exemplary view illustrating an area Y shown in FIG. 4, FIG. 8A is an exemplary view illustrating a cross-section taken along line A-A' shown in FIG. 7, and FIG. 8B is another exemplary view illustrating a cross-section taken along line A-A' shown in FIG. 7. In particular, the area Y shown in FIG. 7 corresponds to an area in which the repair line 107 of the light emitting display panel shown in FIGS. 6A and 6B is provided. FIG. 8A illustrates a cross-section of the area Y before the repair process is performed, and FIG. 8B illustrates a cross-section of the area Y after the repair process is performed. In the following description, the same or similar description as or to that described with reference to FIGS. 1 to 6B will be omitted or briefly described.

In the light emitting display panel 100 applied to the present disclosure, as described with reference to FIGS. 8A and FIGS. 5A to 5E, light shielding electrodes including a first light shielding voltage supply line PLA1a, a second light shielding voltage supply line PLA2a and a repair line 107 are provided on the substrate 110. The light shielding electrodes may be formed of various types of metals.

After the repair line 107 is covered by a buffer 120, a pixel driving layer 130 including a pixel driving unit PDU is provided on an upper end of the buffer 120. In particular, the upper end of the buffer 120 shown in FIG. 8A is provided with active electrodes 133 used as semiconductors or electrodes of transistors constituting the pixel driving unit PDU. The buffer 120 may include at least one organic layer or at least one organic layer, or may include at least one organic layer and at least one inorganic layer.

The active electrodes 133 are covered by a gate insulating layer 131, and a first branch voltage supply line 105 and a second branch voltage supply line 106 are provided on an upper end of the gate insulating layer 131.

The first branch voltage supply line 105 and the second branch voltage supply line 106 are covered by a passivation layer 132.

That is, the pixel driving layer 130 includes active electrodes 133, a gate insulating layer 131, a passivation layer 132 and gate electrodes, and the pixel driving layer 130 includes various transistors as described with reference to FIG. 2.

The passivation layer 132 is covered by a planarization layer 140.

A first contact hole 107a for connecting the repair line 107 with the first branch voltage supply line 105 are provided in the planarization layer 140 and the passivation layer 132. That is, the planarization layer 140, the passivation layer 132, the gate insulating layer 131 and the buffer 120 are removed by the first contact hole 107a, and thus the repair line 107 is exposed in the contact hole 107a.

A first pixel electrode 107b is provided in the first contact hole 107a of the upper end of the planarization layer 140. The repair line 107 and the first branch voltage supply line 105 may be connected with each other by the first pixel electrode 107b. In this case, the first pixel electrode 107b may also be connected with the active electrode 133.

An anode 150 is provided on an upper end of the planarization layer 140, a light emitting layer constituting a light emitting element ED is provided on an upper end of the anode 150, and a cathode constituting the light emitting device ED is provided on an upper end of the light emitting layer. At least one encapsulation film is provided on an upper end of the cathode, and thus a light emitting display panel is manufactured. The first pixel electrode 107b may be covered by a bank that distinguishes the pixels.

That is, in the normal light emitting display panel 100, as shown in FIG. 8A, the first branch voltage supply line 105 is connected with the repair line 107, and the repair line 107 and the first branch voltage supply line 105 are not connected with the second branch voltage supply line 106.

However, as shown in FIG. 6A, when the gate line is opened and thus the repair process described with reference to FIG. 6B is performed, the second branch voltage supply line 106 is connected with the repair line 107 as shown in FIG. 8B. Therefore, as described above, a closed circuit connecting the first branch voltage supply line 105, the repair line 107 and the second branch voltage supply line 106 with one another may be formed.

In this case, the second branch voltage supply line 106 may be recessed by a laser and connected with the repair line 107 as shown in FIG. 8B.

For example, when the laser is irradiated from a lower end of the substrate 110, the buffer 120 and the gate insulating layer 131, which are provided between the repair line 107 and the second branch voltage supply line 106, may be removed by the laser. Therefore, the second branch voltage supply line 106 provided on the upper end of the buffer 120 and the gate insulating layer 131 is recessed in a direction of the repair line 107, whereby the second branch voltage supply line 106 may be connected with the repair line 107 in a first contact area C1.

According to the present disclosure described as above, the gate signal GS may be supplied through the closed circuit connecting the first branch voltage supply line 105, the repair line 107 and the second branch voltage supply line 106. Therefore, light may normally be output from the other pixels except four pixels among the pixels connected to the opened gate line. Therefore, yield of the light emitting display apparatus may be improved.

The present disclosure described as above is summarized as follows.

An end of the first branch voltage supply line 105 and an end of the second branch voltage supply line 106 are adjacent to each other.

In this case, as shown in FIGS. 6A to 8B, the end of the first branch voltage supply line 105 and the end of the second branch voltage supply line 106 overlap the repair line 107 provided on the substrate 110.

The first branch voltage supply line 105 and the second branch voltage supply line 106 are spaced apart from each other on the upper end of the buffer 120 covering the repair line.

The first voltage supply line PLA1 includes a first light shielding voltage supply line PLA1*a* provided on the substrate 110, and a first gate voltage supply line PLA1*b* provided on the upper end of the buffer 120 covering the first light shielding voltage supply line PLA1*a*, overlapped with the first light shielding voltage supply line PLA1*a* and connected with the first light shielding voltage supply line PLA1*a*.

The second voltage supply line PLA2 includes a second light shielding voltage supply line PLA2*a* provided on the substrate 110, and a second gate voltage supply line PLA2*b* provided on the upper end of the buffer 120 covering the second light shielding voltage supply line PLA2*a*, overlapped with the second light shielding voltage supply line PLA2*a* and connected with the second light shielding voltage supply line PLA2*a*.

The first branch voltage supply line 105 is a first branch gate voltage supply line extended from the first gate voltage supply line PLA1*b* in a first direction, and the second branch voltage supply line 106 is a second branch gate voltage supply line extended from the second gate voltage supply line PLA2*b* in the first direction.

That is, the first branch voltage supply line 105 is diverged from the first gate voltage supply line PLA1*b*, and the second branch voltage supply line 106 is diverged from the second gate voltage supply line PLA2*b*.

The end of the first branch voltage supply line 105 (or first branch gate voltage supply line) and the end of the second branch voltage supply line 106 (or second branch gate voltage supply line) are overlapped with the repair line 107 provided on the same layer as the first light shielding voltage supply line PLA1*a* and the second light shielding voltage supply line PLA2*a*.

The gate line GL is provided on the same layer as the first gate voltage supply line PLA1*b* and the second gate voltage supply line PLA2*b* and crosses the first light shielding voltage supply line PLA1*a* and the second light shielding voltage supply line PLA2*a*.

As shown in FIG. 8A, the end of the first branch voltage supply line 105 is connected with the repair line 107 through the first pixel electrode 107*b* provided in the first contact hole 107*a*.

The repair line 107 is covered by the buffer 120, and the buffer 120 is provided with an active electrode 133 constituting a transistor provided in the pixel driving unit PDU. The active electrode 133 is covered by the gate insulating layer 131, and the gate insulating layer 131 is provided with the first branch voltage supply line 105 and the second branch voltage supply line 106. The first branch voltage supply line 105 and the second branch voltage supply line 106 are covered by the passivation layer 132 and the planarization layer 140. The first contact hole 107*a* exposes the repair line 107 by passing through the planarization layer 140, the gate insulating layer 131 and the buffer 120, and the first pixel electrode 107*b* is in contact with the first branch voltage supply line 105, the active electrode 133 and the repair line 107.

When the repair process is performed, the end of the second branch voltage supply line 106 is connected with the repair line 107 by passing through the gate insulating layer 131 and the buffer 120.

Hereinafter, a light emitting display apparatus having a structure different from that of the light emitting display apparatus described with reference to FIGS. 4 to 8B will be described with reference to FIGS. 9 to 13B. In the following description, the same or similar description as or to that described with reference to FIGS. 1 to 8B will be omitted or briefly described.

Figure 9:
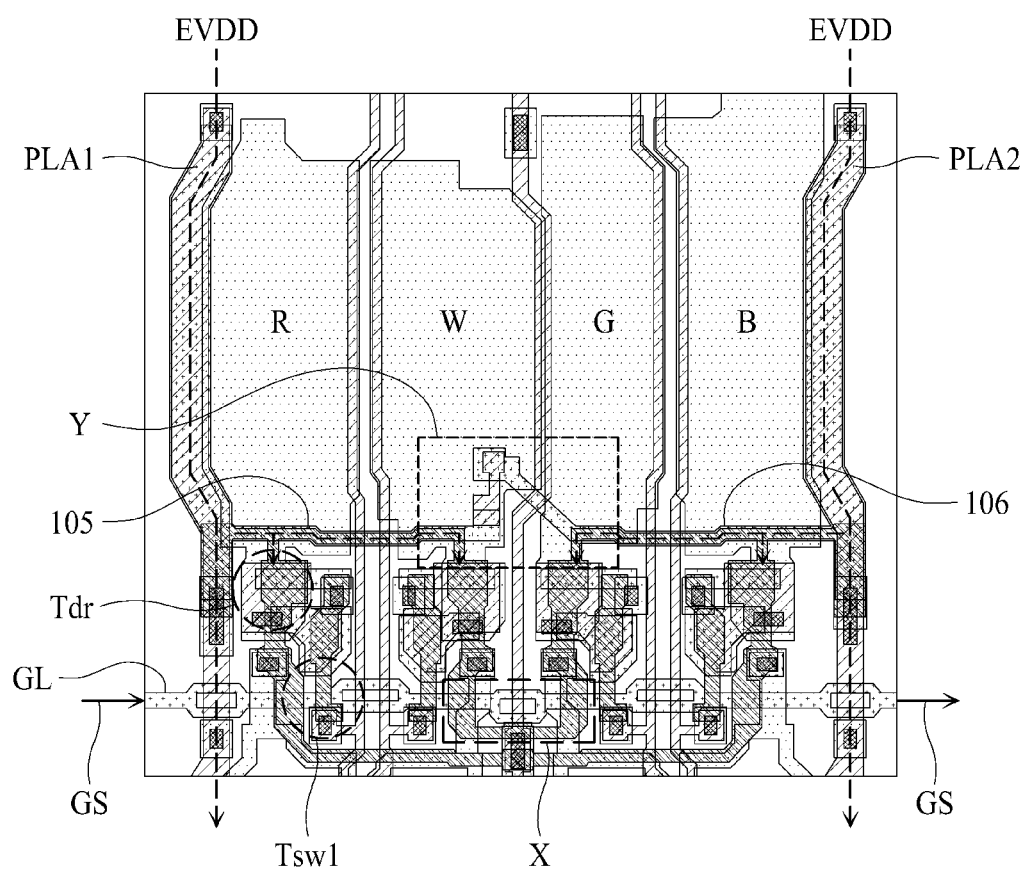
FIG. 9 is an exemplary view illustrating four pixels provided in a light emitting display panel applied to a light emitting display apparatus according to the present disclosure.

FIG. 9 is an exemplary view illustrating four pixels provided in a light emitting display panel applied to a light emitting display apparatus according to the present disclosure, and FIGS. 10A to 10E are exemplary views illustrating a method of manufacturing a light emitting display panel shown in FIG. 9.

As described above, the light emitting display apparatus according to the present disclosure includes a gate line GL, a first voltage supply line PLA1, a second voltage supply line PLA2, four pixels R, W, G and B provided between two voltage supply lines PLA1 and PLA2, which are adjacent to each other, and connected to the gate line GL, a first branch voltage supply line 105 and a second branch voltage supply line 106, wherein an end of the first branch voltage supply line 105 and an end of the second branch voltage supply line 106 are adjacent to each other.

When the gate line GL to which four pixels 101 are connected is not opened, as shown in FIG. 9, the first voltage EVDD supplied through the first voltage supply line PLA1 is supplied to the red pixel R and the white pixel W through the first branch voltage supply line 105, and the first voltage EVDD supplied through the second voltage supply line PLA2 is supplied to the green pixel G and the blue pixel B through the second branch voltage supply line 106. Further, the gate signal GS is supplied to all pixels connected to the gate line GL as well as the four pixels R, W, G and B through the gate line GL.

That is, the light emitting display panel 100 of a normal state in which the gate line GL is not opened is shown in FIG. 9.

In this case, in the area indicated by Yin FIG. 9, the end of the first branch voltage supply line 105 and the end of the second branch voltage supply line 106 are adjacent to each other but are not connected to each other.

That is, in the light emitting display apparatus described with reference to FIGS. 4 to 8B, the end of the first branch voltage supply line 105 is connected with the repair line 107, but in the light emitting display apparatus described with reference to FIGS. 9 to 13B, the end of the first branch voltage supply line 105 and the end of the second branch voltage supply line 106 are not connected to the repair line 107.

The method of manufacturing the light emitting display panel having the structure described as above will briefly be described with reference to FIGS. 10A to 10E.

Figure 10A:
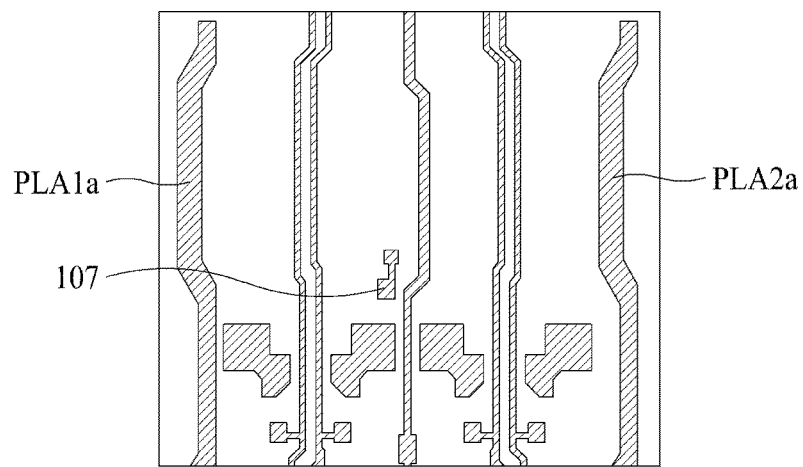
FIGS. 10A to 10E are exemplary views illustrating a method of manufacturing a light emitting display panel shown in FIG. 9.

First of all, as shown in FIG. 10A, light shielding electrodes including a first light shielding voltage supply line PLA1a, a second light shielding voltage supply line PLA2a and a repair line 107 are provided on a substrate.

Figure 10B:
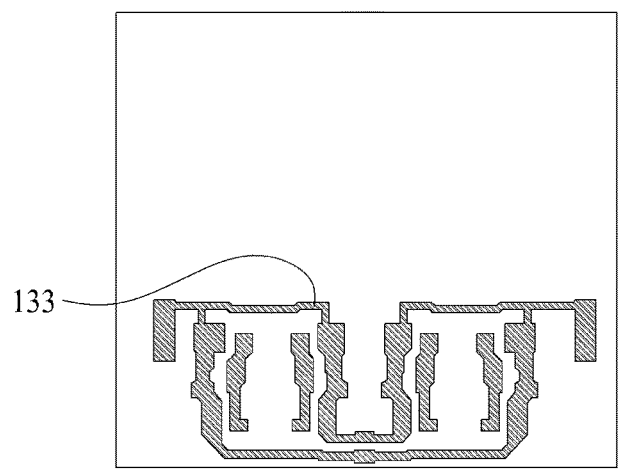

After the light shielding electrodes are covered by a buffer, as shown in FIG. 10B, active electrodes 133 used as semiconductors of transistors constituting the pixel driving unit PDU are provided on an upper end of the buffer.

Figure 10C:
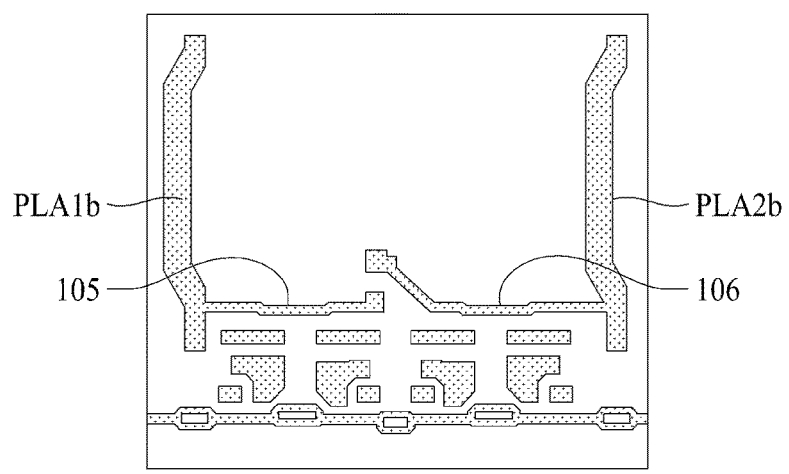

Next, after the active electrodes are covered by a gate insulating layer, as shown in FIG. 10C, gate electrodes including a first gate voltage supply line PLA1b, a second gate voltage supply line PLA2b, a first branch voltage supply line 105, a second branch voltage supply line 106 and a gate line GL are provided on an upper end of the gate insulating layer.

In particular, as shown in FIG. 10C, the end of the first branch voltage supply line 105 and the end of the second branch voltage supply line 106 are adjacent to each other, but are not connected to each other.

In this case, the end of the first branch voltage supply line 105 and the end of the second branch voltage supply line 106 are provided to overlap the repair line 107 shown in FIG. 10A.

Next, the gate electrodes are covered by a passivation layer, and the passivation layer is covered by a planarization layer.

Figure 10D:
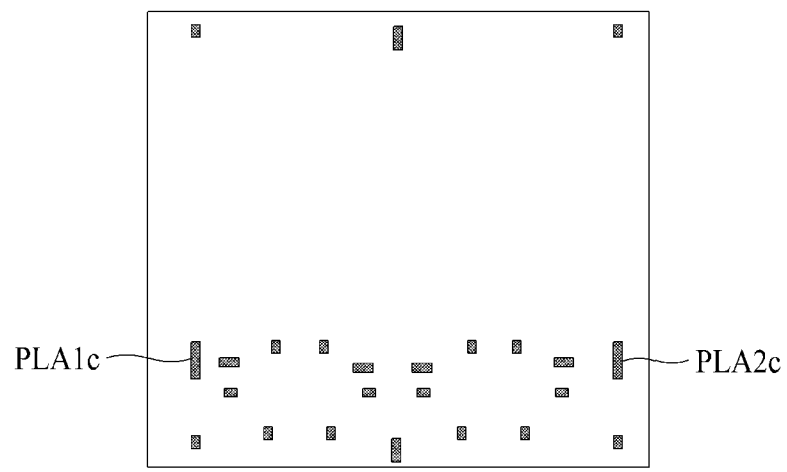
Figure 10E:
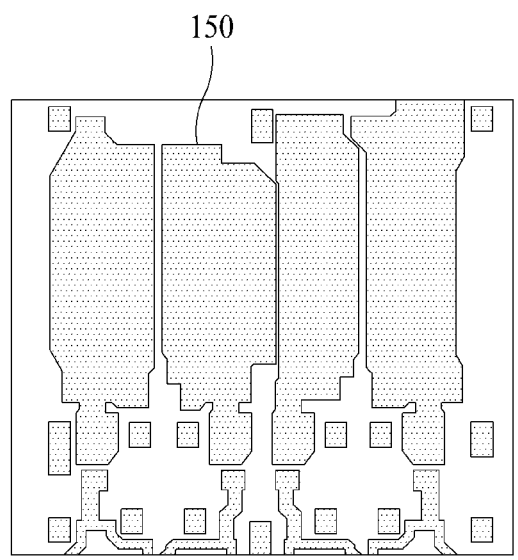

As shown in FIG. 10D, contact holes including a first voltage supply line contact hole PLA1c for connecting the first light shielding voltage supply line PLA1a shown in FIG. 10A with the first gate voltage supply line PLA1b shown in FIG. 10C and a second voltage supply line contact hole PLA2c for connecting the second light shielding voltage supply line PLA2a shown in FIG. 10A with the second gate voltage supply line PLA2b shown in FIG. 10C are provided in the passivation layer and the planarization layer. In this case, since the first branch voltage supply line 105 and the second branch voltage supply line 106 are not connected with the repair line 107, unlike FIG. 5C, a first contact hole for connecting the first branch voltage supply line 105 with the repair line 107 is not provided in FIG. 10C.

Finally, an anode 150 constituting the light emitting element ED and pixel electrodes including a first pixel electrode 107b are provided in the planarization layer.

A light emitting layer constituting the light emitting device ED is provided on an upper end of the anode 150, and a cathode constituting the light emitting device ED is provided on an upper end of the light emitting layer.

At least one encapsulation film is provided on an upper end of the cathode, and thus the light emitting display panel is manufactured.

Figure 11A:
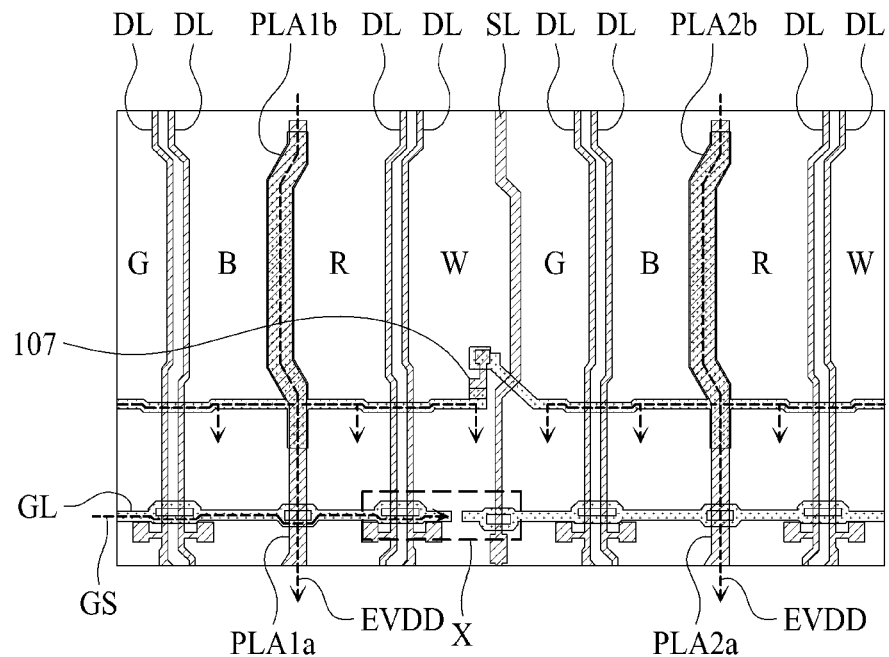
FIG. 11A is an exemplary view illustrating pixels comprised of light shielding electrodes shown in FIG. 10A and gate electrodes shown in FIG. 10C.
Figure 11B:
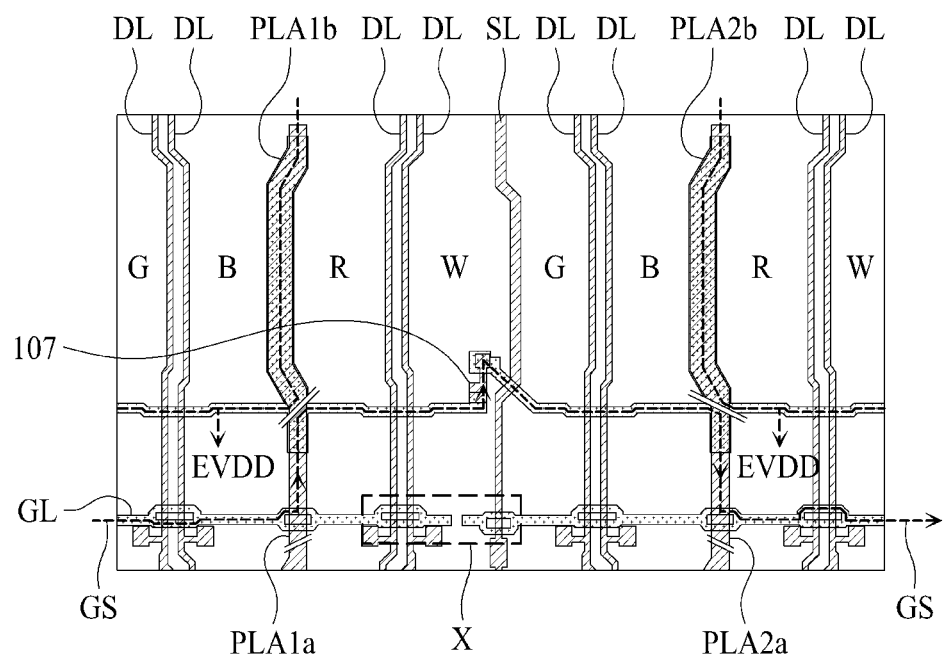
FIG. 11B is an exemplary view illustrating a light emitting display panel that is repaired.

FIG. 11A is an exemplary view illustrating pixels comprised of light shielding electrodes shown in FIG. 10A and gate electrodes shown in FIG. 10C. In particular, the first light shielding voltage supply line PLA1a, the second light shielding voltage supply line PLA2a, and the repair line 107 of the light shielding electrodes shown in FIG. 10A are only shown in FIG. 11A. Also, the first gate voltage supply line PLA1b, the first branch voltage supply line 105, the second gate voltage supply line PLA2b, the second branch voltage supply line 106 and the gate line GL of the gate electrodes shown in FIG. 10C are only shown in FIG. 11A. That is, the essential elements required for description of the present disclosure are only shown in FIG. 11A. FIG. 11B is an exemplary view illustrating a light emitting display panel that is repaired. That is, in FIG. 11B, the first branch voltage supply line 105 and the second branch voltage supply line 106, which are shown in FIG. 11a, are connected with each other through the repair line 107.

First of all, in the light emitting display panel shown in FIG. 11a, the first voltage EVDD supplied through the first voltage supply line PLA1 is supplied to the red pixel R and the white pixel W provided on the right side of the first voltage supply line PLA1 through the first branch voltage supply line 105 provided on the right side of the first voltage supply line PLA1. The first voltage EVDD supplied through the first voltage supply line PLA1 is also supplied to the green pixel G and the blue pixel B provided on the left side of the first voltage supply line PLA1.

The first voltage EVDD supplied through the second voltage supply line PLA2 is supplied to the green pixel G and the blue pixel B provided on the left side of the second voltage supply line PLA2 through the second branch voltage supply line 106 provided on the left side of the second voltage supply line PLA2. The first voltage EVDD supplied through the second voltage supply line PLA2 is also supplied to the red pixel R and the white pixel W provided on the right side of the second voltage supply line PLA2.

In this case, the gate line GL is connected in the area indicated by X in the light emitting display panel shown in FIG. 9A, but the gate line GL is opened in the area indicated by X in the light emitting display panel shown in FIG. 11a. Therefore, the gate signal GS supplied from the gate driver 200 provided on the left side of the first voltage supply line PLA1 is not supplied to the pixels provided on the right side of the area indicated by X.

In this case, as shown in FIG. 11B, a repair process for connecting the first branch voltage supply line 105 and the second branch voltage supply line 106, which are adjacent to each other, with each other through the repair line 107 may be performed. Since the repair process of the light emitting display panel as shown in FIG. 11B is the same as that described with reference to FIG. 6B, its detailed description will be omitted.

When the repair process is performed, as shown in FIG. 11B, a closed circuit connected to the gate line GL provided on the left side of the first voltage supply line PLA1, the first voltage supply line PLA1, the first branch voltage supply line 105, the repair line 107, the second branch voltage supply line 106, the second voltage supply line PLA2 and the gate line GL provided on the right side of the second voltage supply line PLA2 is formed.

Therefore, the gate signal GS supplied from the gate driver 200 provided on the left side of the first voltage supply line PLA1 may be transmitted through the closed circuit.

Therefore, even though the gate line is opened between the first voltage supply line PLA1 and the second voltage supply line PLA2, the gate signal GS may be supplied to the other pixels except the four pixels R, W, G and B provided between the first voltage supply line PLA1 and the second voltage supply line PLA2.

Therefore, according to the present disclosure, light may normally be output from the other pixels except four pixels among the pixels connected to the opened gate line. As a result, yield of the light emitting display apparatus may be improved.

In particular, in the light emitting display apparatus described with reference to FIGS. 9 to 13B, before the repair process is performed, the end of the first branch voltage supply line 105 and the end of the second branch voltage supply line 106 are not connected with the repair line 107. Therefore, a first contact hole for connecting the end of the first branch voltage supply line 105 or the end of the second branch voltage supply line 106 with the repair line 107 is not required. Therefore, a decrease in an aperture ratio of a pixel may be minimized, and thus lifetime of the light emitting display apparatus may be improved.

Figure 12:
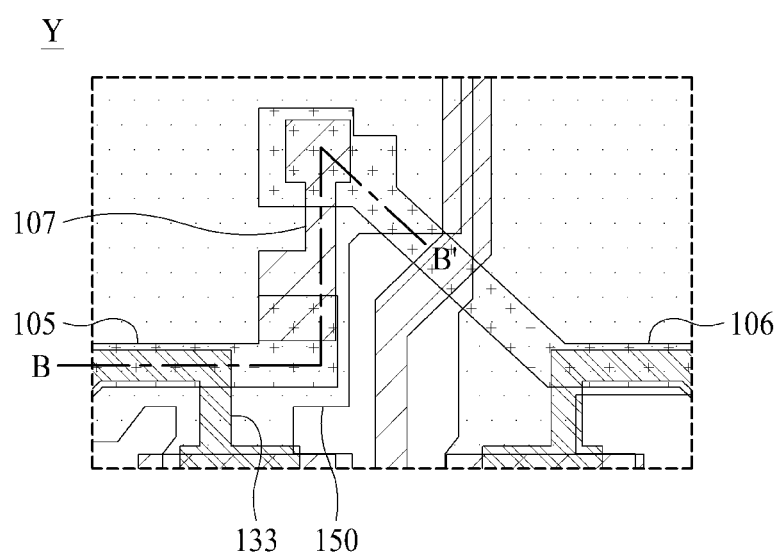
FIG. 12 is an enlarged exemplary view illustrating area Y shown in FIG. 9.
Figure 13A:
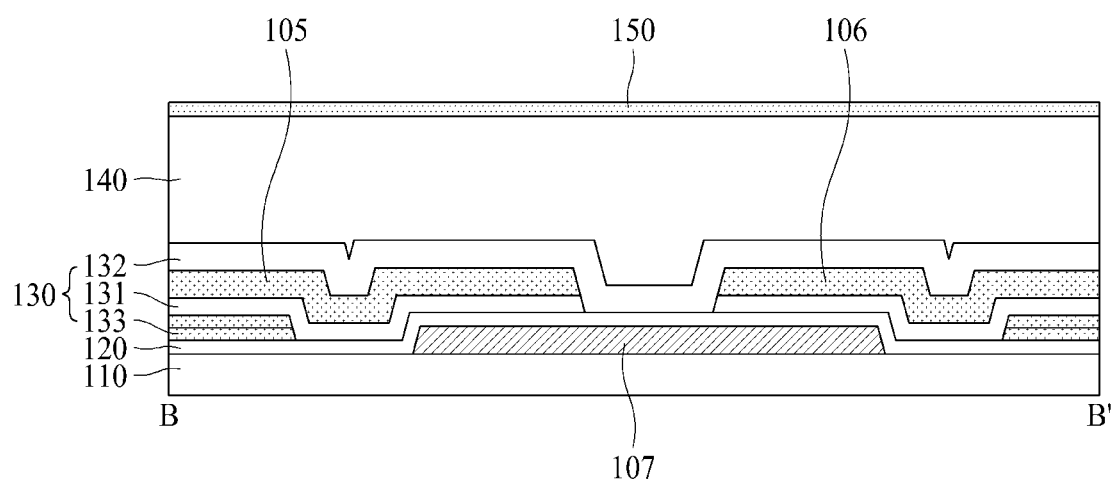
FIG. 13A is an exemplary view illustrating a cross-section taken along line B-B' shown in FIG. 12.
Figure 13B:
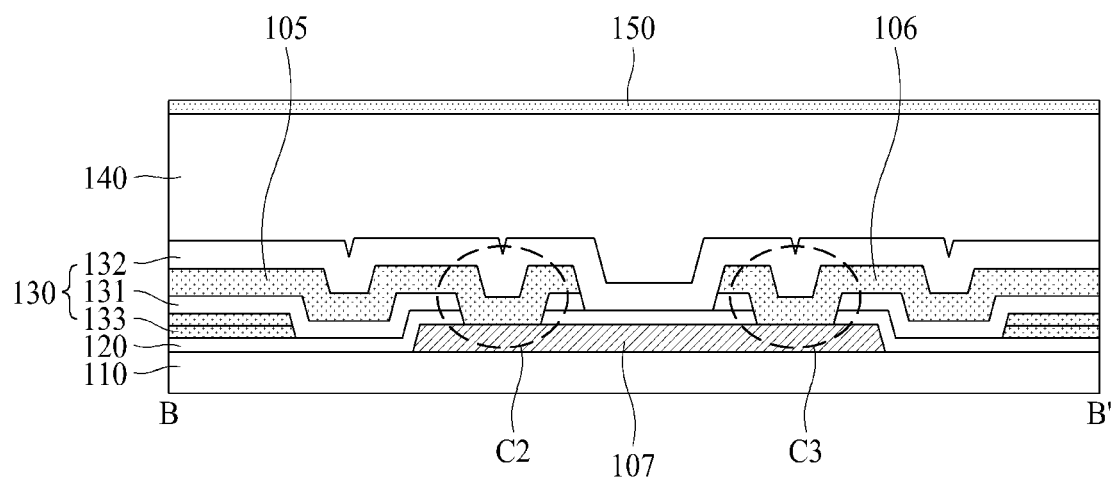
FIG. 13B is another exemplary view illustrating a cross-section taken along line B-B' shown in FIG. 12.

FIG. 12 is an enlarged exemplary view illustrating an area Y shown in FIG. 9, FIG. 13A is an exemplary view illustrating a cross-section taken along line B-B' shown in FIG. 12, and FIG. 13B is another exemplary view illustrating a cross-section taken along line B-B' shown in FIG. 12. In particular, the area Y shown in FIG. 12 corresponds to an area in which the repair line 107 of the light emitting display panel shown in FIGS. 11A and 11B is provided. Also, FIG. 13A illustrates a cross-section of the area Y before the repair process is performed, and FIG. 13B illustrates a cross-section of the area Y after the repair process is performed.

In the light emitting display panel 100 applied to the present disclosure, as described with reference to FIGS. 13A and FIGS. 10A to 10E, light shielding electrodes including a first light shielding voltage supply line PLA1*a*, a second light shielding voltage supply line PLA2*a* and a repair line 107 are provided on the substrate 110. The light shielding electrodes may be formed of various types of metals.

After the repair line 107 is covered by a buffer 120, a pixel driving layer 130 including a pixel driving unit PDU is provided on an upper end of the buffer 120. In particular, the upper end of the buffer 120 shown in FIG. 13A is provided with active electrodes 133 used as semiconductors or electrodes of transistors constituting the pixel driving unit PDU. The buffer 120 may include at least one organic layer or at least one organic layer, or may include at least one organic layer and at least one inorganic layer.

The active electrodes 133 are covered by a gate insulating layer 131, and a first branch voltage supply line 105 and a second branch voltage supply line 106 are provided on an upper end of the gate insulating layer 131.

The first branch voltage supply line 105 and the second branch voltage supply line 106 are covered by a passivation layer 132.

That is, the pixel driving layer 130 includes active electrodes 133, a gate insulating layer 131, a passivation layer 132 and gate electrodes, and the pixel driving layer 130 includes various transistors as described with reference to FIG. 2.

The passivation layer 132 is covered by a planarization layer 140.

An anode 150 is provided on an upper end of the planarization layer 140, a light emitting layer constituting a light emitting element ED is provided on an upper end of the anode 150, and a cathode constituting the light emitting device ED is provided on an upper end of the light emitting layer. At least one encapsulation film is provided on an upper end of the cathode, and thus a light emitting display panel is manufactured.

As described above, the end of the first branch voltage supply line 105 and the end of the second branch voltage supply line 106 are not connected with the repair line 107. Therefore, a first contact hole for connecting the end of the first branch voltage supply line 105 or the end of the second branch voltage supply line 106 with the repair line 107 is not formed.

That is, in the normal light emitting display panel 100, as shown in FIG. 13A, the first branch voltage supply line 105 and the second branch voltage supply line 106 are not connected with the repair line 107.

However, as shown in FIG. 11*a*, when the gate line is opened and thus the repair process described with reference to FIG. 11B is performed, the first branch voltage supply line 105 and the second branch voltage supply line 106 are connected with the repair line 107 as shown in FIG. 13B.

Therefore, as described above, a closed circuit connecting the first branch voltage supply line 105, the repair line 107 and the second branch voltage supply line 106 with one another may be formed.

In this case, the first branch voltage supply line 105 and the second branch voltage supply line 106 may be recessed by a laser and connected with the repair line 107 as shown in FIG. 13B.

For example, when the laser is irradiated from a lower end of the substrate 110, the buffer 120 and the gate insulating layer 131, which are provided between the first branch voltage supply line 105 and the second branch voltage supply line 106 and the repair line 107, may be removed by the laser.

Therefore, the first branch voltage supply line 105 provided on the upper end of the buffer 120 and the gate insulating layer 131 is recessed in a direction of the repair line 107, whereby the first branch voltage supply line 105 may be connected with the repair line 107 in a second contact area C2.

Also, the second branch voltage supply line 106 provided on the upper end of the buffer 120 and the gate insulating layer 131 is recessed in the direction of the repair line 107, whereby the second branch voltage supply line 106 may be connected with the repair line 107 in a third contact area C3.

The present disclosure described with reference to FIGS. 9 to 13B is characterized as follows.

The repair line 107 is covered by the buffer 120 and the gate insulating layer 131, and the gate insulating layer 131 is provided with the first branch voltage supply line 105 and the second branch voltage supply line 106. The end of the first branch voltage supply line 105 and the end of the second branch voltage supply line 106 are spaced apart from each other in the area where the first branch voltage supply line 105 and the second branch voltage supply line 106 overlap the repair line 107.

In this case, the end of the first branch voltage supply line 105 and the end of the second branch voltage supply line 106 are not connected with the repair line 107.

When the repair process is performed, the end of the first branch voltage supply line 105 is connected with the repair line 107 by passing through the buffer 120, and the end of the second branch voltage supply line 106 is connected with the repair line 107 by passing through the buffer.

The repair line 107 is covered by the buffer 120, and the buffer 120 is provided with an active electrode 133 constituting a transistor. The active electrode 133 is covered by the gate insulating layer 131, and the gate insulating layer 131 is provided with the first branch voltage supply line 105 and the second branch voltage supply line 106. The first branch voltage supply line 105 and the second branch voltage supply line 106 are covered by the passivation layer 132, and the passivation layer 132 is covered by the planarization layer 140. The end of the first branch voltage supply line 105 and the end of the second branch voltage supply line 106 are spaced apart from each other, and the buffer 120 exposed to the area where the end of the first branch voltage supply line 105 and the end of the second branch voltage supply line 106 are spaced apart from each other is covered by the gate insulating layer 131 and the planarization layer 140.

According to the present disclosure described as above, the gate signal GS may be supplied through the closed circuit for connecting the first branch voltage supply line 105, the repair line 107 and the second branch voltage supply line 106. Therefore, light may normally be output from the other pixels except four pixels among the pixels connected to the opened gate line. Therefore, yield of the light emitting display apparatus may be improved.

In addition, since a first contact hole for connecting the end of the first branch voltage supply line 105 or the end of the second branch voltage supply line 106 with the repair line 107 is not required, a decrease in an aperture ratio of the pixel may be minimized, and thus lifetime of the light emitting display apparatus may be improved.

According to the present disclosure, the following advantageous effects may be obtained. According to the present disclosure, since the gate signal may be supplied to the pixels connected to the opened gate line, yield of the light emitting display panel may be improved.

In particular, according to the present disclosure, a decrease in an aperture ratio of the pixel may be minimized, and thus lifetime of the light emitting display apparatus may be improved.

It will be apparent to those skilled in the art that the present disclosure described above is not limited by the above-described aspects and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A light emitting display apparatus comprising:
a gate line provided along a first direction of a light emitting display panel;
first and second voltage supply lines provided in the light emitting display panel along a second direction different from the first direction;
at least three pixels provided between two adjacent voltage supply lines and connected to the gate line;
a first branch voltage supply line extended from the first voltage supply line along the first direction and connected to at least one pixel adjacent to the first voltage supply line; and
a second branch voltage supply line extended from the second voltage supply line along the first direction and connected to at least one pixel adjacent to the second voltage supply line,
wherein an end of the first branch voltage supply line and an end of the second branch voltage supply line are adjacent to each other,
the end of the first branch voltage supply line and the end of the second branch voltage supply line overlap with a repair line provided on a substrate, and
the first branch voltage supply line and the second branch voltage supply line are spaced apart from each other on an upper end of a buffer covering the repair line.

2. The light emitting display apparatus of claim 1, wherein the first voltage supply line includes:
a first light shielding voltage supply line provided on a substrate; and
a first gate voltage supply line provided on an upper end of a buffer covering the first light shielding voltage supply line, overlapping with the first light shielding voltage supply line and connected with the first light shielding voltage supply line,
wherein the second voltage supply line includes:
a second light shielding voltage supply line provided on the substrate; and
a second gate voltage supply line provided on the upper end of the buffer covering the second light shielding voltage supply line, overlapping with the second light shielding voltage supply line and connected with the second light shielding voltage supply line.

3. The light emitting display apparatus of claim 2, wherein the first branch voltage supply line includes a first branch gate voltage supply line extended from the first gate voltage supply line in the first direction, and
wherein the second branch voltage supply line includes a second branch gate voltage supply line extended from the second gate voltage supply line in the first direction.

4. The light emitting display apparatus of claim 2, wherein the end of the first branch voltage supply line and the end of the second branch voltage supply line overlapping with a repair line provided on a same layer as the first light shielding voltage supply line and the second light shielding voltage supply line.

5. The light emitting display apparatus of claim 2, wherein the gate line is provide on a same layer as the first gate voltage supply line and the second gate voltage supply line and crosses the first light shielding voltage supply line and the second light shielding voltage supply line.

6. The light emitting display apparatus of claim 1, wherein the end of the first branch voltage supply line is connected with the repair line through a first pixel electrode provided in a first contact hole.

7. The light emitting display apparatus of claim 6, wherein the repair line is covered by a buffer provided with an active electrode constituting a transistor,
wherein the active electrode is covered by a gate insulating layer, the gate insulating layer is provided with the first branch voltage supply line and the second branch voltage supply line,
wherein the first branch voltage supply line and the second branch voltage supply line are covered by a planarization layer,
wherein the first contact hole exposes the repair line by passing through the planarization layer, the gate insulating layer and the buffer, and wherein the first pixel electrode is in contact with the first branch voltage supply line, the active electrode and the repair line.

8. The light emitting display apparatus of claim 6, wherein the end of the second branch voltage supply line is connected with the repair line by passing through the buffer when a repair process is performed.

9. The light emitting display apparatus of claim 1, wherein the repair line is covered by a buffer and a gate insulating layer provided with the first branch voltage supply line and the second branch voltage supply line,
   wherein the end of the first branch voltage supply line and the end of the second branch voltage supply line are spaced apart from each other in an area where the end of the first branch voltage supply line and the end of the second branch voltage supply line overlap with the repair line.

10. The light emitting display apparatus of claim 9, wherein the end of the first branch voltage supply line is connected with the repair line by passing through the buffer, and the end of the second branch voltage supply line is connected with the repair line by passing through the buffer when a repair process is performed.

11. The light emitting display apparatus of claim 1, wherein the repair line is covered by a buffer provided with an active electrode constituting a transistor,
   wherein the active electrode is covered by a gate insulating layer provided with the first branch voltage supply line and the second branch voltage supply line,
   wherein the first branch voltage supply line and the second branch voltage supply line are covered by a passivation layer covered by a planarization layer,
   wherein the end of the first branch voltage supply line and the end of the second branch voltage supply line are spaced apart from each other, and
   wherein the buffer is exposed to an area where the end of the first branch voltage supply line and the end of the second branch voltage supply line are spaced apart from each other is covered by the gate insulating layer and the planarization layer.

12. A light emitting display panel comprising:
   a repair line disposed on a substrate;
   a gate line disposed over the substrate;
   first and second voltage supply lines spaced from each other over the substrate;
   a plurality of pixels disposed between two adjacent voltage supply lines and electrically connected to the gate line;
   a first branch voltage supply line extended from the first voltage supply line and electrically connected to at least one pixel adjacent to the first voltage supply line;
   a second branch voltage supply line extended from the second voltage supply line and electrically connected to at least one pixel adjacent to the second voltage supply line, and
   a buffer layer disposed on the repair line,
   wherein the repair line overlaps with end portions of the first and second branch voltage supply lines.

13. The light emitting display panel of claim 12, wherein at least one of the end portions of the first and second branch voltage supply lines is electrically connected through the repair line when a repair process is performed.

14. The light emitting display panel of claim 12, wherein the first voltage supply line includes:
   a first light shielding voltage supply line disposed on a substrate; and
   a first gate voltage supply line disposed on an upper end of the buffer covering the first light shielding voltage supply line, overlapping with the first light shielding voltage supply line and connected with the first light shielding voltage supply line.

15. The light emitting display panel of claim 12, wherein the second voltage supply line includes:
   a second light shielding voltage supply line disposed on the substrate; and
   a second gate voltage supply line disposed on an upper end of the buffer covering the second light shielding voltage supply line, overlapping with the second light shielding voltage supply line and connected with the second light shielding voltage supply line.

16. The light emitting display panel of claim 12, wherein the end of the first branch voltage supply line is connected with the repair line through a first pixel electrode provided in a first contact hole.

17. The light emitting display panel of claim 12, further comprising a pixel driving layer disposed on the buffer layer,
   wherein the pixel driving layer and the buffer layer have a contact hole where at least one of the first and second branch voltage supply lines contacts the repair line when a repair process is performed.

* * * * *